United States Patent
Wang et al.

(10) Patent No.: US 11,145,550 B2
(45) Date of Patent: Oct. 12, 2021

(54) DUMMY FIN TEMPLATE TO FORM A SELF-ALIGNED METAL CONTACT FOR OUTPUT OF VERTICAL TRANSPORT FIELD EFFECT TRANSISTOR

(71) Applicant: International Business Machines Corporation, Armonk, NY (US)

(72) Inventors: Junli Wang, Slingerlands, NY (US); Brent Alan Anderson, Jericho, VT (US); Albert Young, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/809,608

(22) Filed: Mar. 5, 2020

(65) Prior Publication Data

US 2021/0280474 A1    Sep. 9, 2021

(51) Int. Cl.
  *H01L 21/8234*  (2006.01)
  *H01L 29/66*    (2006.01)
  (Continued)

(52) U.S. Cl.
  CPC ........ *H01L 21/823475* (2013.01); *H01L 21/823418* (2013.01); *H01L 21/823431* (2013.01);
  (Continued)

(58) Field of Classification Search
  CPC ..... H01L 21/823885; H01L 21/823487; H01L 21/823871; H01L 21/823475; H01L 21/823821; H01L 21/823431; H01L 29/41791; H01L 29/66795; H01L 29/785–7851; H01L 29/7827; H01L 29/78642; H01L 29/41741; H01L 29/66666; H01L 29/66545; H01L 27/0924;
  (Continued)

(56) References Cited

U.S. PATENT DOCUMENTS 9,530,866 B1 * 12/2016 Zhang ................. H01L 29/0676
9,570,395 B1    2/2017 Sengupta et al.
(Continued)

FOREIGN PATENT DOCUMENTS

TW          201917893 A     5/2019

OTHER PUBLICATIONS

Disclosed anonymously (May 2011). Deep trench and highly doped substrate enhanced power distribution and decoupling structures. IPCOM000207338D. Retrieved from ip.com.
(Continued)

*Primary Examiner* — Errol V Fernandes
*Assistant Examiner* — Jeremy J Joy
(74) *Attorney, Agent, or Firm* — Cantor Colburn LLP; Robert Sullivan

(57) ABSTRACT

A technique relates to a semiconductor device. A source/drain layer is formed. Fins with gate stacks are formed in a fill material, a dummy fin template including at least one fin of the fins and at least one gate stack of the gate stacks, the fins being formed on the source/drain layer. A trench is formed through the fill material by removing the dummy fin template, such that a portion of the source/drain layer is exposed in the trench. A source/drain metal contact is formed on the portion of the source/drain layer in the trench.

15 Claims, 16 Drawing Sheets

(51) Int. Cl.
*H01L 21/8238* (2006.01)
*H01L 29/417* (2006.01)
*H01L 27/092* (2006.01)

(52) U.S. Cl.
CPC .............. *H01L 21/823481* (2013.01); *H01L 21/823487* (2013.01); *H01L 29/66545* (2013.01); *H01L 29/66666* (2013.01); *H01L 29/66795* (2013.01); *H01L 21/823821* (2013.01); *H01L 21/823871* (2013.01); *H01L 27/0924* (2013.01); *H01L 29/41791* (2013.01)

(58) Field of Classification Search
CPC ............ H01L 27/1211; H01L 27/0886; H01L 21/76224–76237; H01L 21/823878; H01L 29/732–73277
See application file for complete search history.

(56) References Cited

U.S. PATENT DOCUMENTS

| | | | | |
|---|---|---|---|---|
| 9,721,845 | B1* | 8/2017 | Cheng | H01L 23/485 |
| 9,735,253 | B1* | 8/2017 | Bi | H01L 29/0847 |
| 10,205,005 | B1* | 2/2019 | Liou | H01L 21/2255 |
| 10,516,030 | B2* | 12/2019 | Pan | H01L 29/66795 |
| 10,522,678 | B2* | 12/2019 | Balakrishnan | H01L 29/66666 |
| 2016/0247899 | A1* | 8/2016 | Bhalla | H01L 29/7802 |
| 2017/0194155 | A1* | 7/2017 | Anderson | H01L 23/535 |
| 2017/0301590 | A1* | 10/2017 | Anderson | H01L 21/823412 |
| 2017/0352742 | A1* | 12/2017 | Cheng | H01L 29/41741 |
| 2017/0373159 | A1* | 12/2017 | Cheng | H01L 21/845 |
| 2018/0240890 | A1 | 8/2018 | Yang et al. | |
| 2018/0294267 | A1* | 10/2018 | Licausi | H01L 23/5286 |
| 2018/0308762 | A1 | 10/2018 | Anderson et al. | |
| 2019/0006351 | A1* | 1/2019 | Zhou | H01L 21/746 |
| 2019/0058036 | A1 | 2/2019 | Smith et al. | |
| 2019/0080969 | A1* | 3/2019 | Tsao | H01L 21/823475 |
| 2019/0214343 | A1* | 7/2019 | Lee | H01L 27/092 |
| 2020/0006552 | A1* | 1/2020 | Anderson | H01L 27/1104 |
| 2020/0027981 | A1* | 1/2020 | Park | H01L 29/0649 |
| 2020/0105671 | A1* | 4/2020 | Lai | G06F 30/394 |
| 2020/0135578 | A1* | 4/2020 | Ching | H01L 21/823475 |
| 2020/0312849 | A1* | 10/2020 | Cheng | H01L 29/41791 |

OTHER PUBLICATIONS

Vashishtha, V. & Clark, L. T. (2018). ASAP7: A finFET-Based Framework for Academic VLSI Design at the 7 nm Node. In Low Power Semiconductor Devices and Processes for Emerging Applications in Communications, Computing, and Sensing (pp. 17-60). CRC Press.

List of IBM Patents or Patent Applications Treated as Related; Date Filed: Jun. 30, 2021, 2 pages.

Wang et al., "Dummy Fin Template to Form a Self-Aligned Metal Contact for Output of Vertical Transport Field Effect Transistor," U.S. Appl. No. 17/363,491, filed Jun. 30, 2021.

* cited by examiner

DUMMY FIN TEMPLATE TO FORM A SELF-ALIGNED METAL CONTACT FOR OUTPUT OF VERTICAL TRANSPORT FIELD EFFECT TRANSISTOR

BACKGROUND

The present invention generally relates to fabrication methods and resulting structures for semiconductor devices, and more specifically, to a dummy fin template to form a self-aligned metal contact for an output signal for a vertical transport field effect transistor (VTFET).

A metal-oxide-semiconductor field-effect transistor (MOSFET) is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on"). A fin-type field effect transistor (fin-FET) is a type of nonplanar MOSFET. FinFET devices include an arrangement of fins disposed on a substrate. The fins are formed from a semiconductor material. A gate stack is arranged over the fins and defines a channel region of the fins, while regions of the fins extending outwardly from the channel region define active source and drain regions of the device. Various state-of-the-art techniques can be used for forming the fin.

Another nonplanar MOSFET that uses fin-shaped structures is a vertical FET. A vertical FET operates like a normal finFET that is horizontal. However, in a vertical FET (VFET) also referred to as a vertical transport field effect transistor (VTFET), the entire fin functions as the channel, and the source and drain regions are positioned at respective ends of the vertically positioned fin such that the current runs vertically from source to drain. Also, the gate of a VTFET usually wraps around the fin-shaped channel.

SUMMARY

Embodiments of the invention are directed to using a dummy fin template to form a self-aligned metal contact for output signal for a vertical field effect transistor VFET. A non-limiting example of a method for forming a semiconductor device includes forming a source/drain layer, and forming fins with gate stacks in a fill material, a dummy fin template including at least one fin of the fins and at least one gate stack of the gate stacks, the fins being formed on the source/drain layer. The method includes forming a trench through the fill material by removing the dummy fin template, such that a portion of the source/drain layer is exposed in the trench, and forming a source/drain metal contact on the portion of the source/drain layer in the trench.

A non-limiting example of a method for forming a semiconductor device includes forming a source/drain layer, forming fins with gate stacks on the source/drain layer, removing one of the fins and a corresponding one of the gate stacks at a location, and forming a metal contact at the location in which the one of the fins and the corresponding one of the gate stacks have been removed.

A non-limiting example of a semiconductor device includes fins with gate stacks formed on a source/drain layer, the fins being vertical fins having a fin height dimension greater than a fin width dimension. The semiconductor device includes a buried power rail coupled with the source/drain layer through a conductive via. Also, the semiconductor device includes a source/drain metal contact formed on the source/drain layer, the source/drain metal contact being aligned in parallel to the fins, such that the source/drain metal contact comprises a height dimension greater that a width dimension.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
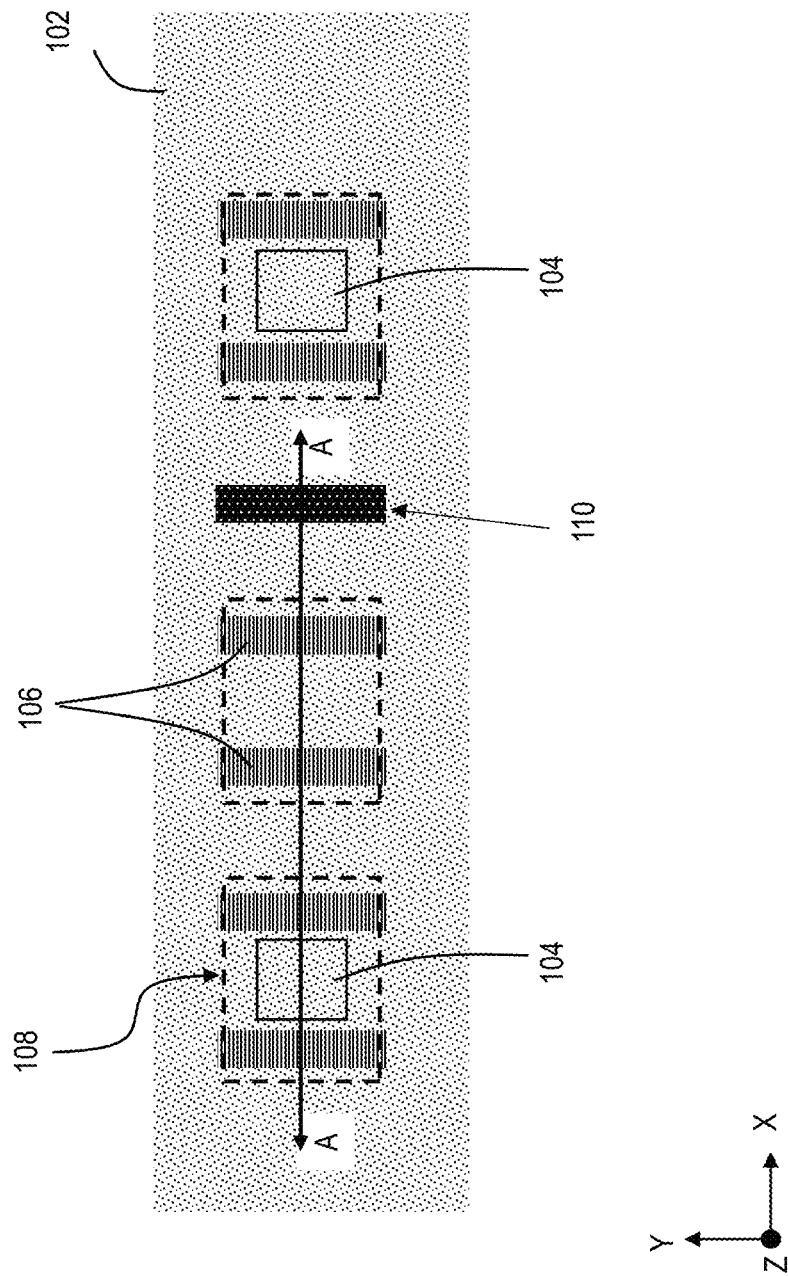
FIG. 1 depicts a simplified version of a top-down view of a semiconductor device according to embodiments of the invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Because future node technology requires further area scaling, reduction in cell height is an effective way for cell area reduction. Under certain ground rules, scaling of cell height will cause fin length reduction, which will result in effective width (Weff) decrease per footprint. Moving the power rail down to the bottom of the device can save the area for a longer fin length, and the power rail can be moved down to the shallow trench isolation (STI) between the cell boundary. Moving the power rail down could be challenging because there is a limited size in the power rail and because the power rail usually needs a large critical dimension (CD) for better current * resistance (IR) drop and electromigration (EM); however, the device still needs contact from the top to connect power rail and bottom source/drain. Although the active region of the transistor could be where the metal contact lands to provide the output signal from the power rail, this could increase the patterning complexity and process variation. In accordance with one or more embodiments of the invention, an improved and/or simpler technique is discussed which uses a dummy fin template that has at least one fin with a gate stack just as the active fins with their gate stacks.

Turning now to an overview of aspects of the invention, one or more embodiments of the invention add a dummy fin in a dummy fin template for a metal contact which couples to a buried power rail for vertical field effect transistors. The dummy fin can be formed and remain before the metallization process. During the metallization process, the dummy fin along with the high-k material and metal gate surrounding the dummy fin are removed, thereby leaving an opening, and the metal contact is formed in the opening. In accordance with one or more embodiments, this technique beneficially addresses the loading effect during fin etch of the active fins and causes the metal contact to always be self-aligned to the dummy fin. As such, one or more embodiments of the invention provide a metal contact using a self-aligned process where the metal contact couples the top of the vertical transistor to the bottom source or drain, thereby enabling an output signal to travel from the bottom source or drain to the top of the transistor.

Figure 2:
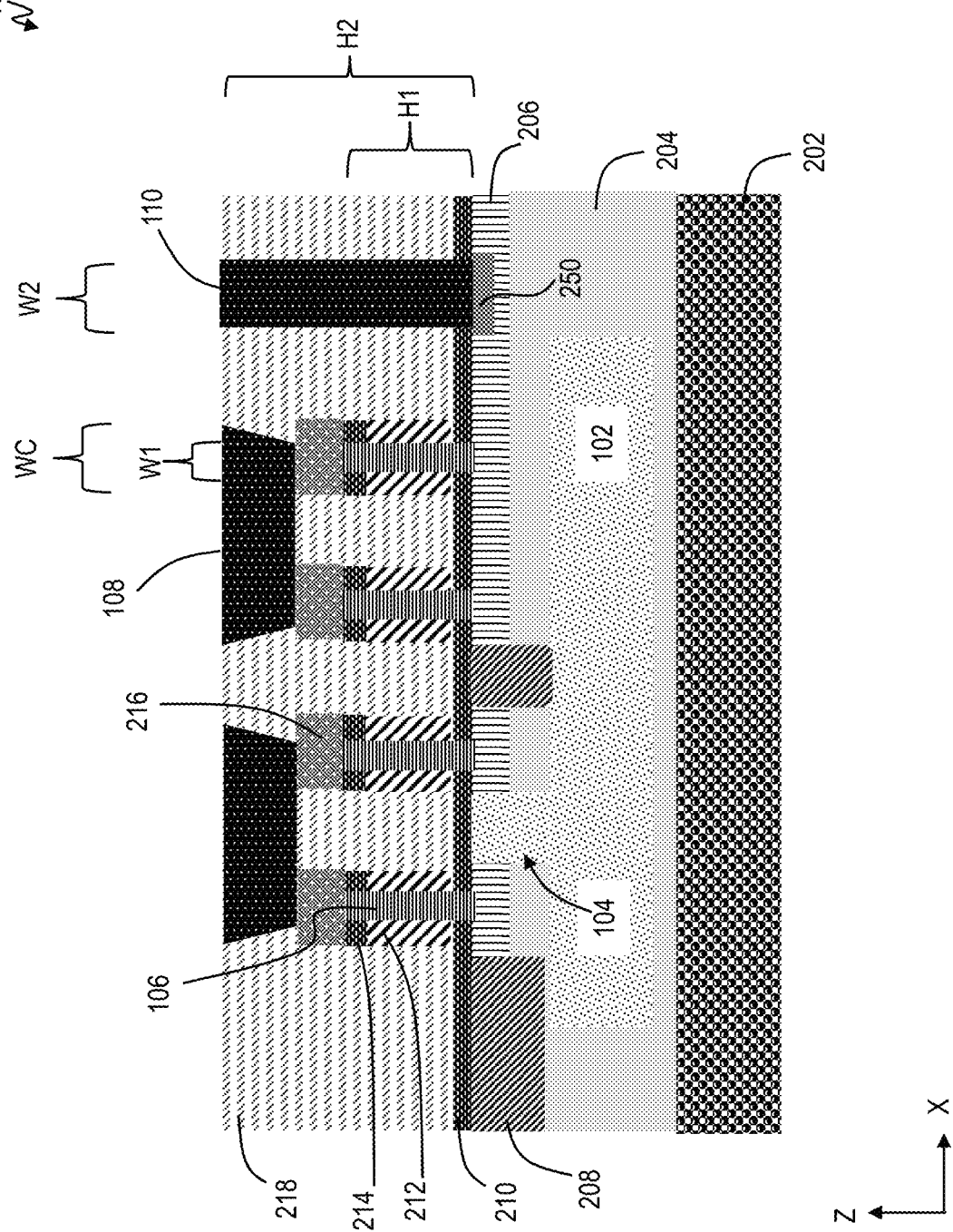
FIG. 2 depicts a cross-sectional view of the semiconductor device taken along line A-A of FIG. 1 after fabrication operations according to embodiments of the invention.

Turning now to a more detailed description of aspects of the present invention, FIG. 1 depicts a simplified top-down view of a semiconductor device 100 according to embodiments of the invention. Some layers are omitted from the top-down view in FIG. 1 so as not to obscure the figures and to illustrate layer(s) underneath. FIG. 2 depicts a cross-sectional view of the semiconductor device 100 taken along line A-A of FIG. 1 according to embodiments of the invention. The semiconductor device 100 can be formed using standard lithography processing, for example, for vertical transistors. After initial fabrication processing and with reference to FIGS. 1 and 2, the semiconductor device 100 includes a dielectric material layer 204 formed on a substrate 202. The substrate 202 can be a wafer. Example materials of the substrate can include silicon (Si), silicon germanium (SiGe), III-V semiconductors, etc. The dielectric material layer 204 can be a low-k dielectric material. The dielectric material layer 204 can include oxides such as silicon dioxide, nitrides such as silicon nitride, etc. A buried power rail (BPR) layer 102 is formed in the dielectric material layer 204. The BPR layer 102 is a conductive material. The BPR layer 102 can be a metal. Example materials of the BPR layer 102 can include ruthenium, cobalt, and tungsten.

A bottom source/drain layer 206 is formed on the dielectric material layer 204. A BPR conductive via 104 is formed to connect the BPR layer 102 and bottom source/drain layer 206. The BPR conductive via 104 can made of the same materials as BPR layer 102. Shallow trench isolation (STI) layers 208 are formed through the bottom source/drain layer 206 and part of the dielectric material layer 204. The STI layers 208 can include low-k dielectric materials. A middle STI layer 208 separates two transistors. For example, one transistor having two fins 106 is on the left side of the semiconductor device 100 and another transistor having two fins 106 is on the right side. It should be appreciated that other implementations are possible according to circuit requirements and/or circuit designs.

The fins 106 are formed on the bottom source/drain layer 206. The fins 106 are semiconductor materials. Example materials of the fins 106 can include silicon (Si), silicon germanium (SiGe), III-V semiconductors, etc. The bottom source/drain layer 206 can be an epitaxial semiconductor layer. The bottom source/drain layer 206 can be a doped semiconductor material. For N-type FETs (NFETs), the bottom source/drain layer 206 can be doped with N-type dopants such as, for example, phosphorus, and arsenic. For P-type FETs (PFETs), the bottom source/drain layer 206 can be doped with P-type dopants such as, for example, gallium (Ga), boron (B), difluoroboron ($BF_2$), and aluminum (Al). NFETs and PFETs can be formed on the same semiconductor device 100. As one example, the fins 106 of the PFET can be silicon germanium (SiGe) doped with boron, while the fins of the NFET can be silicon doped with phosphorus.

A bottom spacer layer 210 is formed on the bottom source/drain layer 206, the STI regions 208, and bottoms parts of the fins 106. The bottom spacer layer 210 can be made of any suitable material, such as, for example, a low-k dielectric, a nitride, silicon nitride, silicon dioxide, SiON, SiC, SiOCN, or SiBCN.

A high-k dielectric material is formed so as to wrap around the fins 106 and a work function material is formed to wrap around the high-k dielectric material. The high-k dielectric material and work function material together form a gate stack 212, sometimes referred to as a high-k metal gate stack. For explanation purposes, a high-k gate dielectric layer can be, for example, a dielectric material with a dielectric constant that is greater than the dielectric constant of silicon dioxide (i.e., greater than 3.9). Exemplary high-k dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). Optionally, the metal layer(s) can include a work function metal that is immediately adjacent to the gate dielectric layer and that is preselected in order to achieve an optimal gate conductor work function given the conductivity type of the FET. For example, the optimal gate conductor work function for the PFETs can be, for example, between about 4.9 eV and about 5.2 eV. Exemplary metals (and metal alloys) having a work function within or close to this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The optimal gate conductor work function for NFETs can be, for example, between 3.9 eV and about 4.2 eV. Exemplary metals (and metal alloys) having a work function within or close to this range include, but are not limited to, hafnium, zirconium, titanium, tantalum, aluminum, and alloys thereof, such as, hafnium carbide, zirconium carbide, titanium carbide, tantalum carbide, and aluminum carbide. The metal layer(s) can further include a fill metal or fill metal alloy, such as tungsten, a tungsten alloy (e.g., tungsten silicide or titanium tungsten), cobalt, aluminum or any other suitable fill metal or fill metal.

Top spacer layers 214 are formed on top of the gate stack 212. The top spacer layer 214 can be formed of any suitable material, such as, for example, a low-k dielectric, a nitride, silicon nitride, silicon dioxide, SiON, SiC, SiOCN, or SiBCN.

Top source/drain layers 216 are formed on the top of fins 106. The top source/drain layers 216 can be an epitaxial semiconductor layer. The top source/drain layers 216 can be a doped semiconductor material. As noted above, for N-type FETs (NFETs), the top source/drain layers 216 can be doped with N-type dopants such as, for example, phosphorus, and arsenic. For P-type FETs (PFETs), the top source/drain layer 216 can be doped with P-type dopants such as, for example, gallium (Ga), boron (B), difluoroboron (BF$_2$), and aluminum (Al).

A fill material 218 can be formed on the bottom spacer layer 210, gate stack 212, top spacer layers 214, and top source/drain layers 216. The fill material 218 can be an interlayer dielectric (ILD). The fill material 218 can be a low-k dielectric material.

Top source/drain metal contacts 108 can be formed on top of the top source/drain layers 216. An optional highly doped section/area 250 can be formed in the bottom source/drain layer 206. The highly doped section 250 can have a higher concentration of dopants than the surrounding area of the bottom/source drain layer 206, thereby causing the highly doped section 250 to be conductive with a bottom/source drain metal contact 110 formed on top of the highly doped section 250. In one or more embodiments of the invention, the highly doped section 250 can be omitted and the bottom source/drain metal contact 110 is formed (directly) on bottom source/drain layer 206.

The fins 106 are vertical fins having a fin height dimension (H1) in the z-axis greater than a fin width dimension (W1) in the x-axis. Further, vertical refers to the extended direction and flow of electrical current in fins 106 which are perpendicular to a horizontal major plane (e.g., the x-y axes) of the substrate 202. The bottom source/drain metal contact 110 is aligned in parallel to the fins 106, such that the bottom source/drain metal contact 110 includes a metal height dimension (H2) in the z-axis greater than a metal width dimension (W2) in the x-axis. The width dimension (W2) of the bottom source/drain metal contact 110 matches a combined width (WC) in the x-axis of one fin (e.g., dummy fin 302) of the fins and one gate stack of the gate stacks 212, i.e., WC is equal to and/or about equal to W2. Further, a top source/drain layer 216 has a width WC, thereby matching the metal width dimension (W2). The metal width dimension (W2) of the bottom source/drain metal contact 110 is in the same plane as the fin width dimension (W1) for the fins 106 including dummy fin 302.

In one or more embodiments of the invention, the substrate 202 can be a (first) wafer with oxide on top, such as dielectric material layer 204. BPR patterning is performed in the oxide and the BPR conductive via 104 is formed in dielectric material layer 204. A second wafer or layer can be bonded on top of the first wafer. Fins 106 can be formed in the material of the second wafer or layer by recessing the material, which also forms a dummy fin template (as discussed further herein). The bottom source/drain layer can be epitaxially grown from the material of the second wafer or layer. The bottom spacer layer 210 and gate stacks 212 are formed, and the top spacer layer 214 and top source/drain layers 216 are formed. A trench through a mask is formed and the dummy fin template is removed, thereby opening a portion of the source/drain layer 206 in the trench. The source/drain metal contact 110 is formed on the opened portion of the source/drain layer 206.

Figure 3:
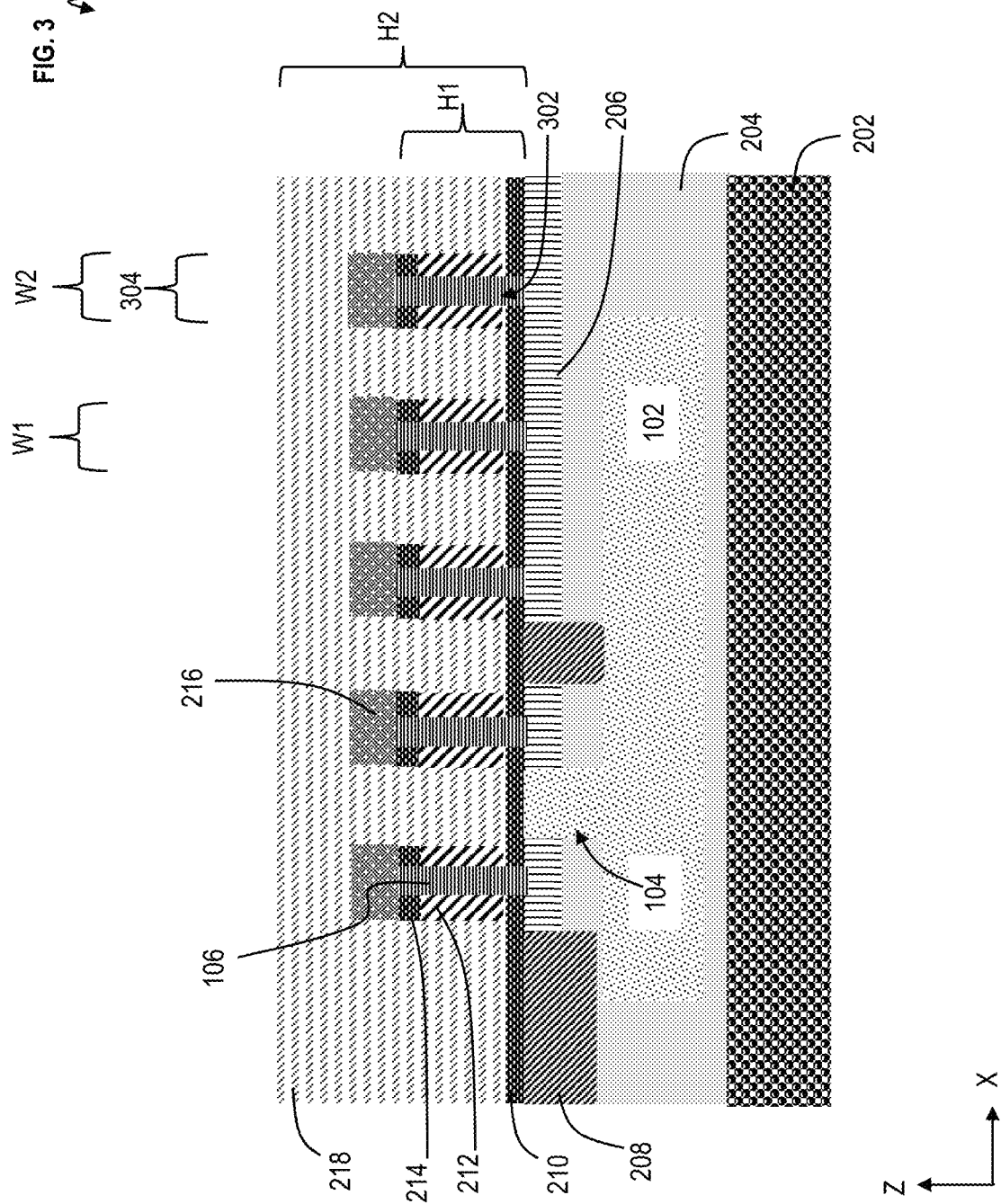
FIG. 3 depicts a cross-sectional view of the semiconductor device taken along line A-A of FIG. 1 after fabrication operations according to embodiments of the invention.

Turning to fabrication operations of forming the semiconductor 100, FIGS. 3-11 depict cross-sectional views of the semiconductor device 100 taken along line A-A of FIG. 1 according to embodiments of the invention. After initial fabrication operations, FIG. 3 shows a dummy fin template 304 which is to result in and/or define the location for the bottom source/drain metal contact 110. The dummy fin template 304 is formed together with (and/or identical to) the active fins 106, which is subsequent to the metal gate process. The dummy fin template 304 includes gate stack 212, top spacer layers 214, top source/drain layer 216, and fin 106. In dummy fin template 304, fin 106 is designated as dummy fin 302 because the dummy fin 302 is a sacrificial fin. In particular, the gate stack 212, top spacer layers 214, top source/drain layer 216 are all sacrificial layers within dummy fin template 304, and therefore the dummy fin template 304 provides self-alignment for the bottom source/drain metal contact 110. Although one dummy fin template is illustrated, some semiconductor devices can have more than one dummy fin template.

Figure 4:
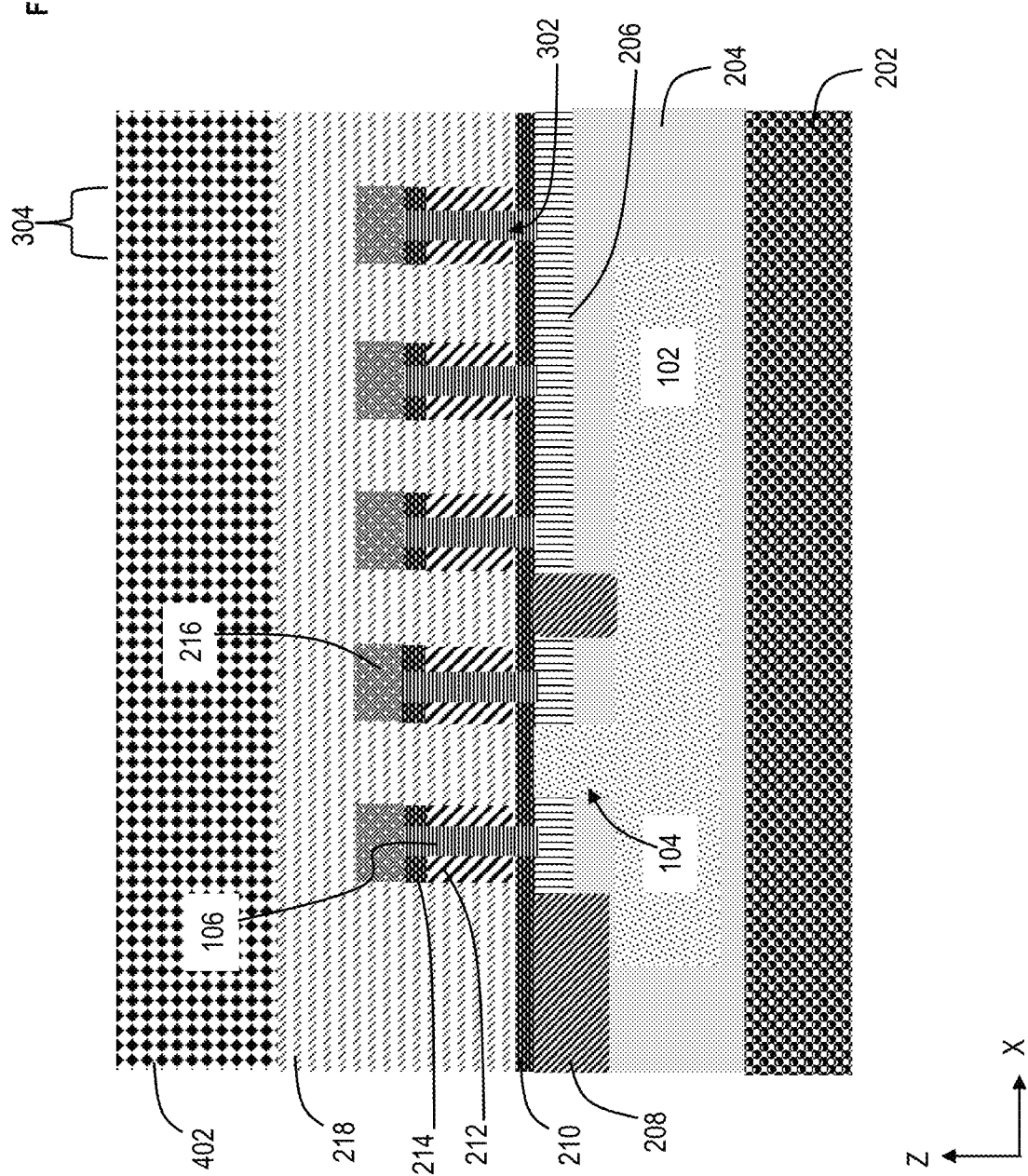
FIG. 4 depicts a cross-sectional view of the semiconductor device taken along line A-A of FIG. 1 after fabrication operations according to embodiments of the invention.

FIG. 4 depicts a cross-sectional view of the semiconductor device 100 taken along line A-A of FIG. 1 after fabrication operations according to embodiments of the invention. A block mask 402 is formed on the fill material 218. The block mask 402 can be made of any suitable material, such as, for example, a silicon nitride, silicon dioxide, SiON, SiC, SiOCN, and/or SiBCN. In one or more embodiments of the invention, the block mask 402 can include an organic planarization layer (OPL).

Figure 5:
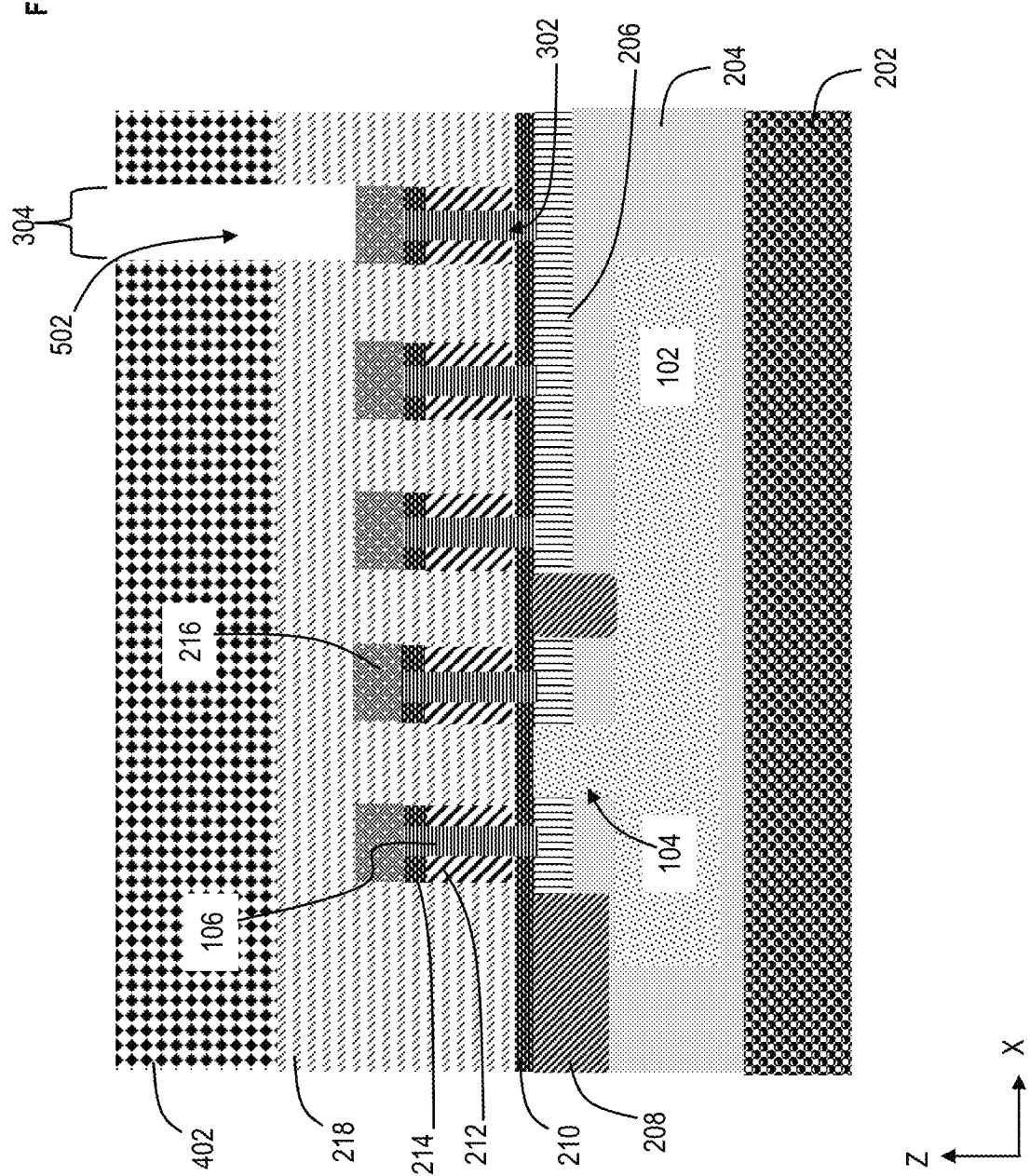
FIG. 5 depicts a cross-sectional view of the semiconductor device taken along line A-A of FIG. 1 after fabrication operations according to embodiments of the invention.

FIG. 5 depicts a cross-sectional view of the semiconductor device 100 taken along line A-A of FIG. 1 after fabrication operations according to embodiments of the invention. A trench 502 is formed through the block mask 402 and fill material 218, exposing the top of top source/drain layer 216 of the dummy fin template 304, while the other fins 106 are protected. The trench 502 can be formed using reactive ion etching (RIE). A photoresist material (not shown) could be used to pattern the trench 502.

Figure 6:
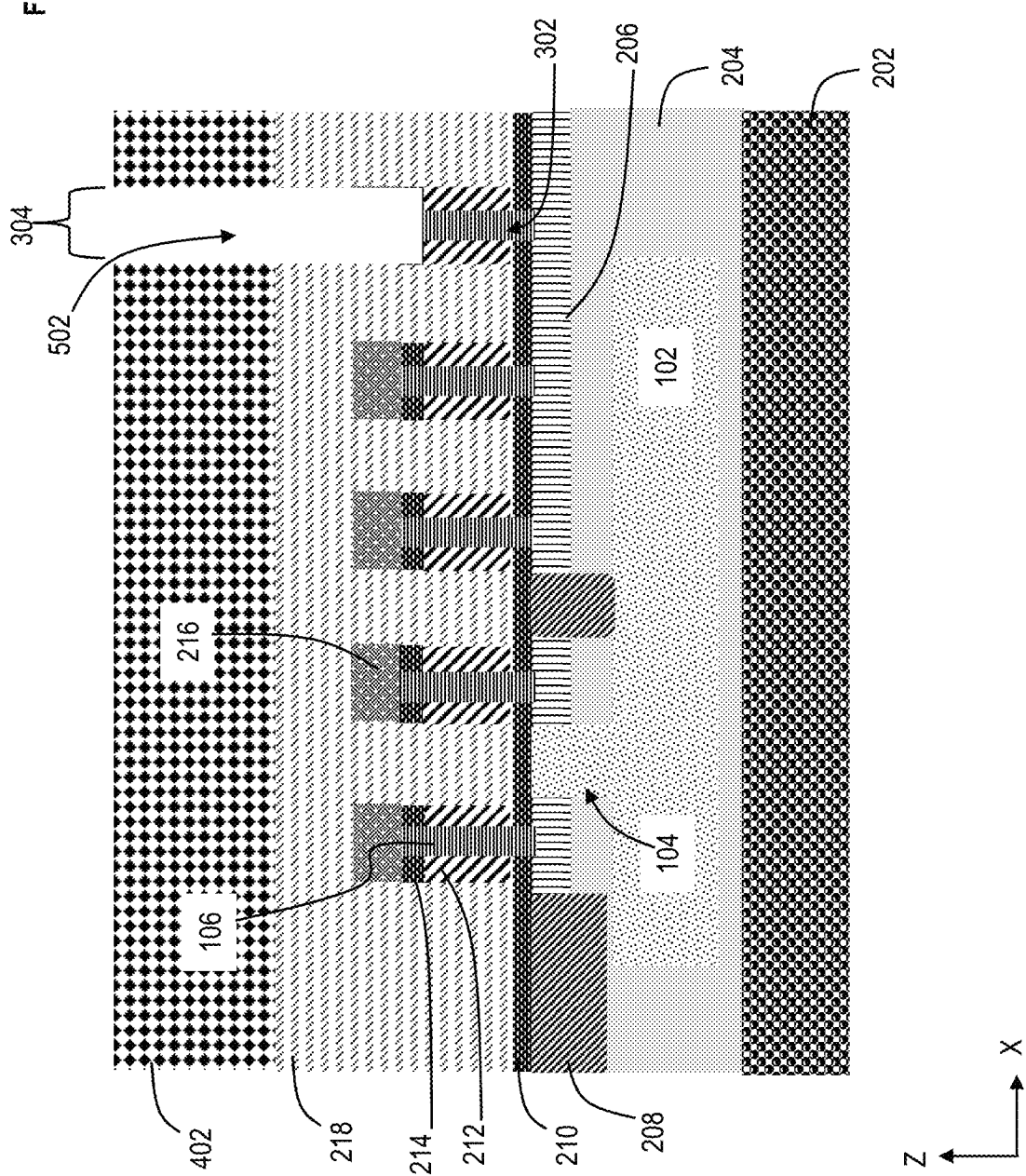
FIG. 6 depicts a cross-sectional view of the semiconductor device taken along line A-A of FIG. 1 after fabrication operations according to embodiments of the invention.

FIG. 6 depicts a cross-sectional view of the semiconductor device 100 taken along line A-A of FIG. 1 after fabrication operations according to embodiments of the invention. The top source/drain layer 216 and top spacer layers 214 are removed in the dummy fin template 304, while the other fins 106 remain protected. The top source/drain layer 216 and top spacer layers 214 can be removed by an RIE etch. After etching, the trench 502 exposes the gate stack 212 and dummy fin 302.

Figure 7:
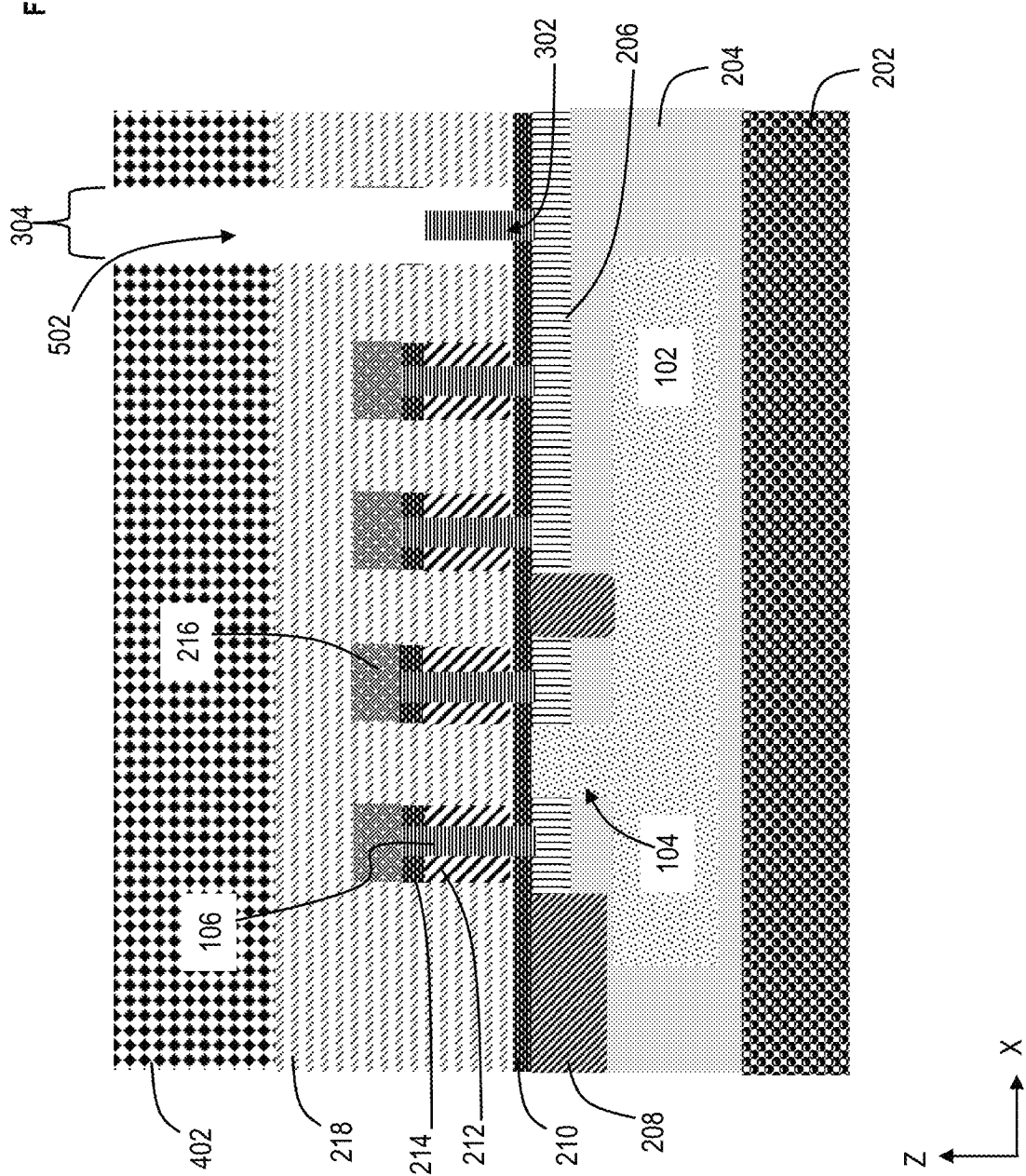
FIG. 7 depicts a cross-sectional view of the semiconductor device taken along line A-A of FIG. 1 after fabrication operations according to embodiments of the invention.

FIG. 7 depicts a cross-sectional view of the semiconductor device 100 taken along line A-A of FIG. 1 after fabrication operations according to embodiments of the invention. The gate stack 212 is removed, for example, using a wet etch or dry etch. The wet etch can be the RCA standard clean 1 and 2 process (SC-1 and SC-2) and/or HF/HCl solution. The dry etch can be isotropic dry etching by $CF_4$ and $Cl_2/HBr/O_2$-based chemistries. As a result, the dummy fin 302 of the dummy fin template 304 and bottom spacer layer 210 are exposed in trench 502.

Figure 8:
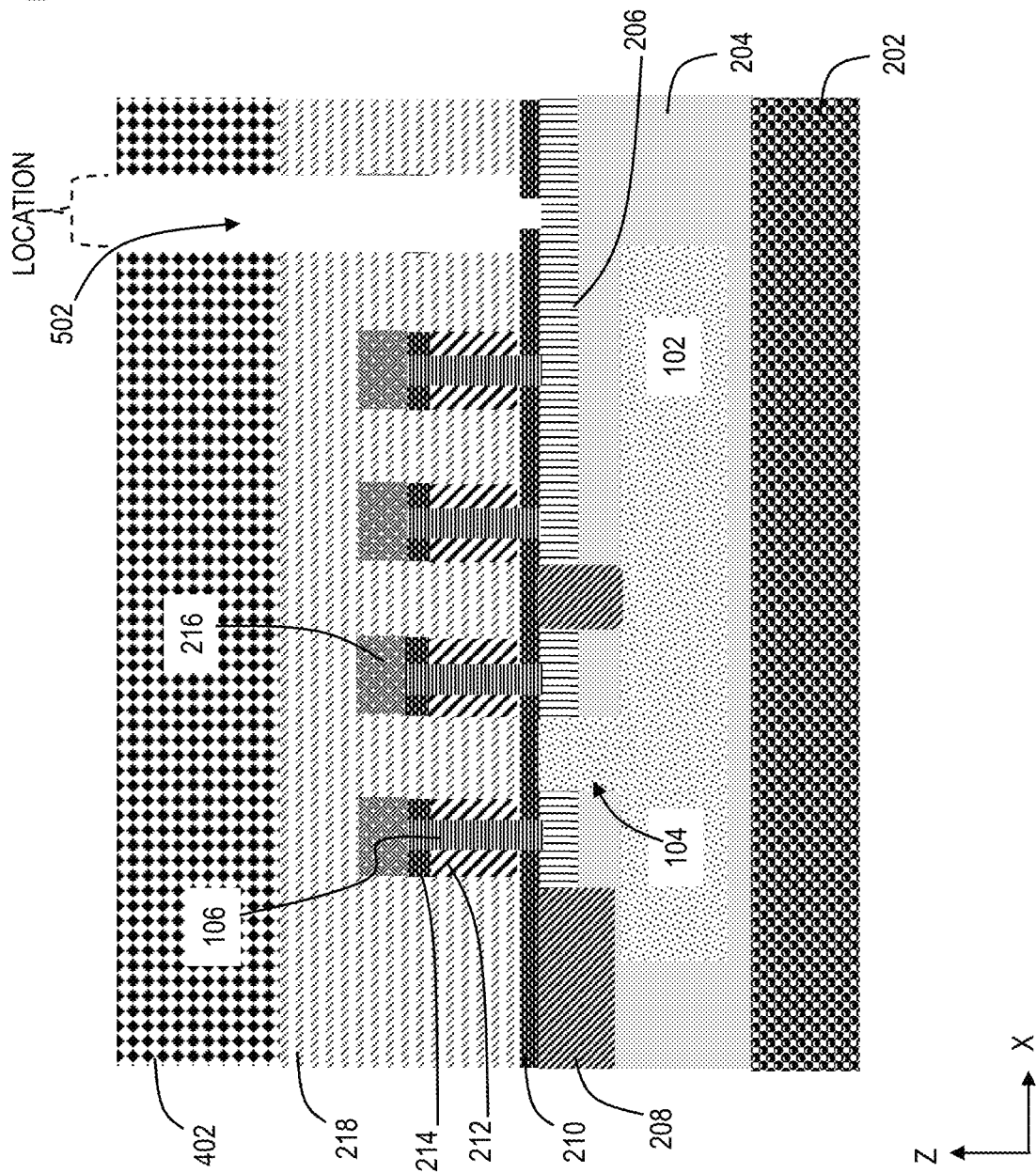
FIG. 8 depicts a cross-sectional view of the semiconductor device taken along line A-A of FIG. 1 after fabrication operations according to embodiments of the invention.

FIG. 8 depicts a cross-sectional view of the semiconductor device 100 taken along line A-A of FIG. 1 after fabrication operations according to embodiments of the invention. Dummy fin removal is performed. The dummy fin 302 of the dummy fin template 304 can be removed using, for example, ammonia with a controlled etch time. Because the dummy fin template 304 has been removed, the previous location of the dummy fin template 304 is represented with a dashed-line bracket.

Figure 9:
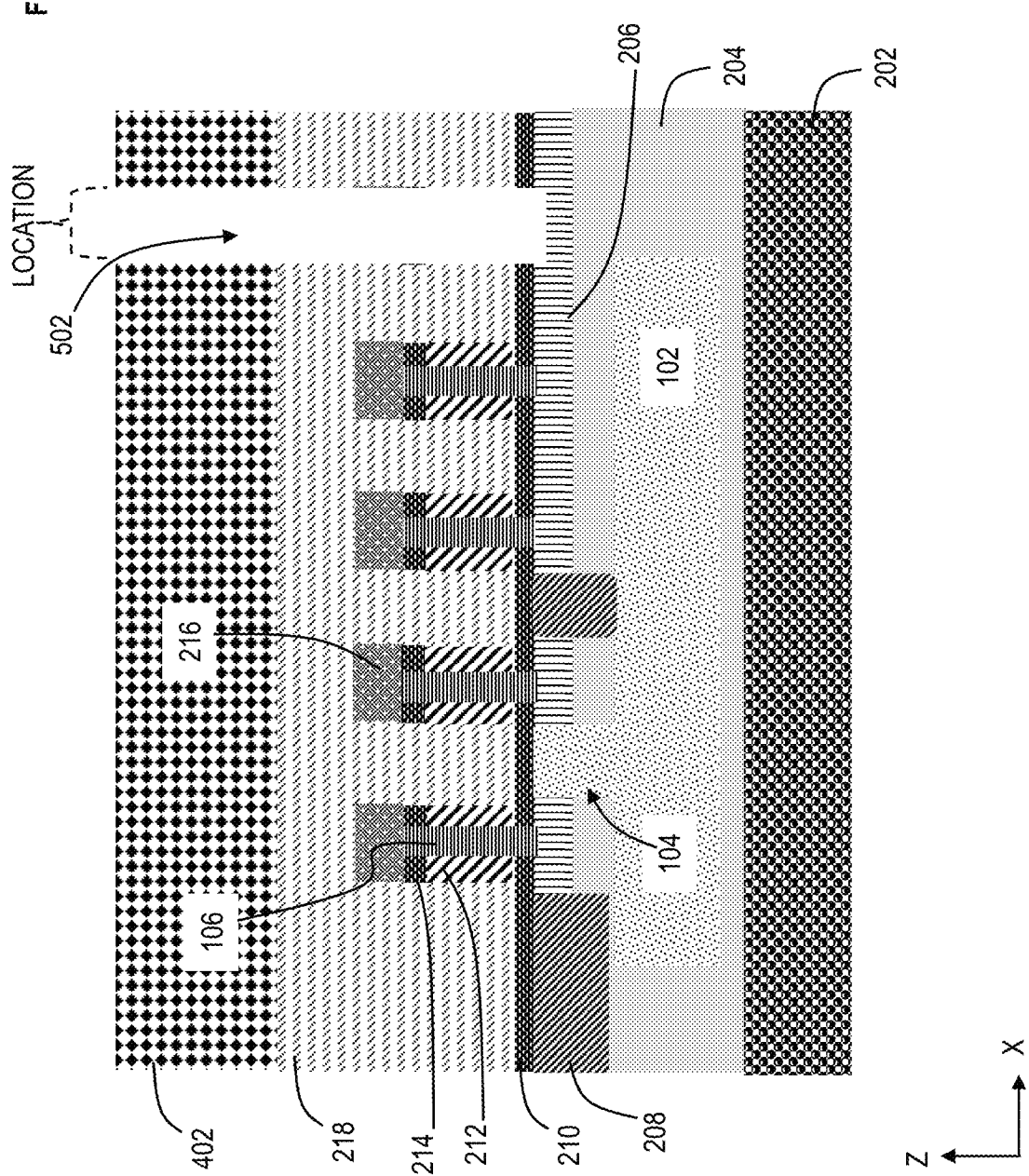
FIG. 9 depicts a cross-sectional view of the semiconductor device taken along line A-A of FIG. 1 after fabrication operations according to embodiments of the invention.

FIG. 9 depicts a cross-sectional view of the semiconductor device 100 taken along line A-A of FIG. 1 after fabrication operations according to embodiments of the invention. Bottom spacer etch is performed. The portion of the bottom spacer layer 210 in the location of the dummy fin template 304 can be removed using, for example, an RIE etch. As a result, the bottom source/drain layer 206 is exposed in the trench 502 at the dummy fin template location. In some cases, a portion of the bottom source/drain layer 206 might or might not be removed when etching the bottom spacer layer 210.

Figure 10:
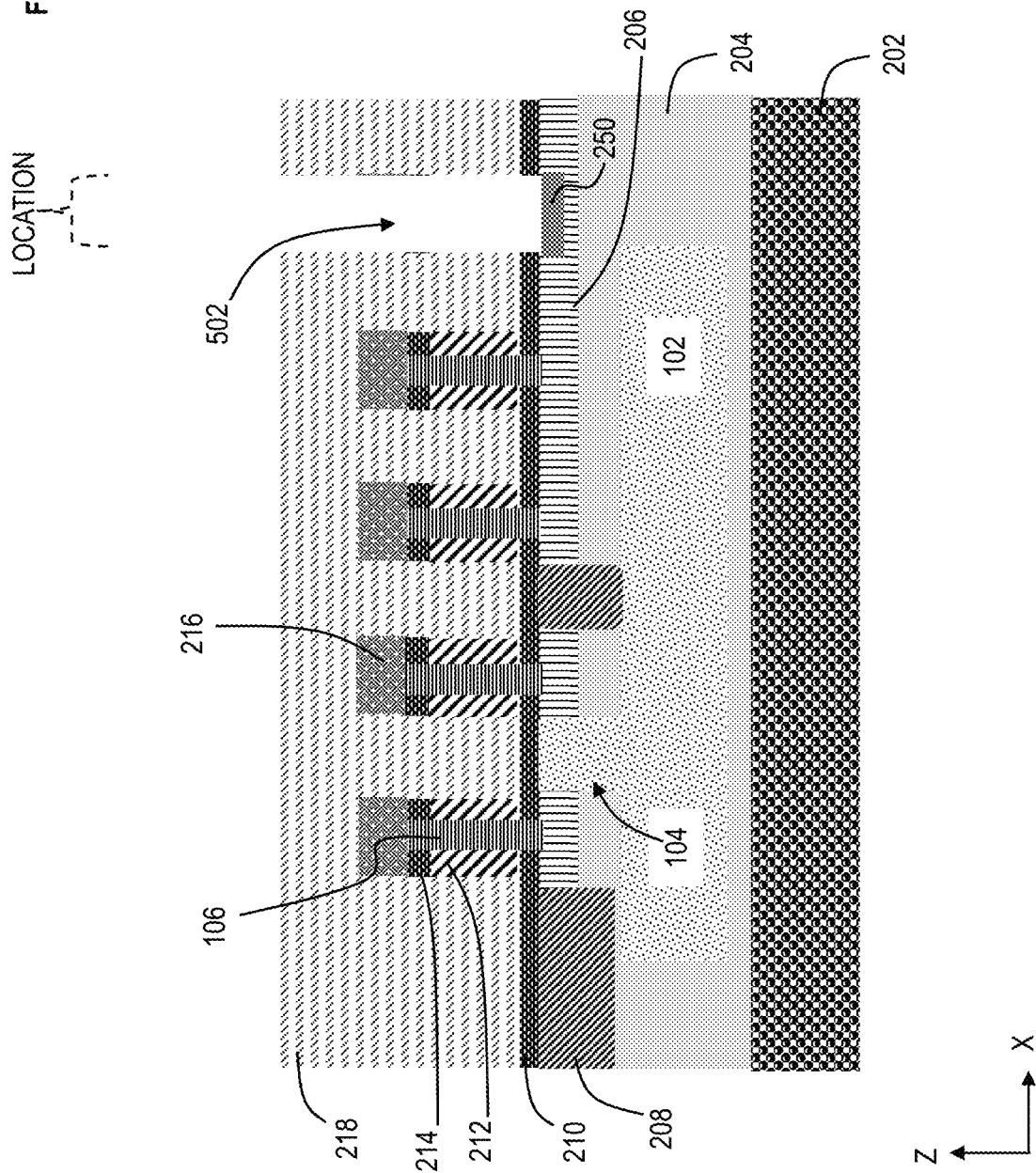
FIG. 10 depicts a cross-sectional view of the semiconductor device taken along line A-A of FIG. 1 after fabrication operations according to embodiments of the invention.

FIG. 10 depicts a cross-sectional view of the semiconductor device 100 taken along line A-A of FIG. 1 after fabrication operations according to embodiments of the invention. Further doping of the bottom source/drain layer 206 can be performed, resulting in the (optional) highly doped section 250. The highly doped section 250 can be doped with N-type dopants and/or P-type dopants. As one example, the doping can be by laser implantation followed by anneal in preparation for the bottom source/drain metal contact 110. Other types of doping methods can be used as well.

Figure 11:
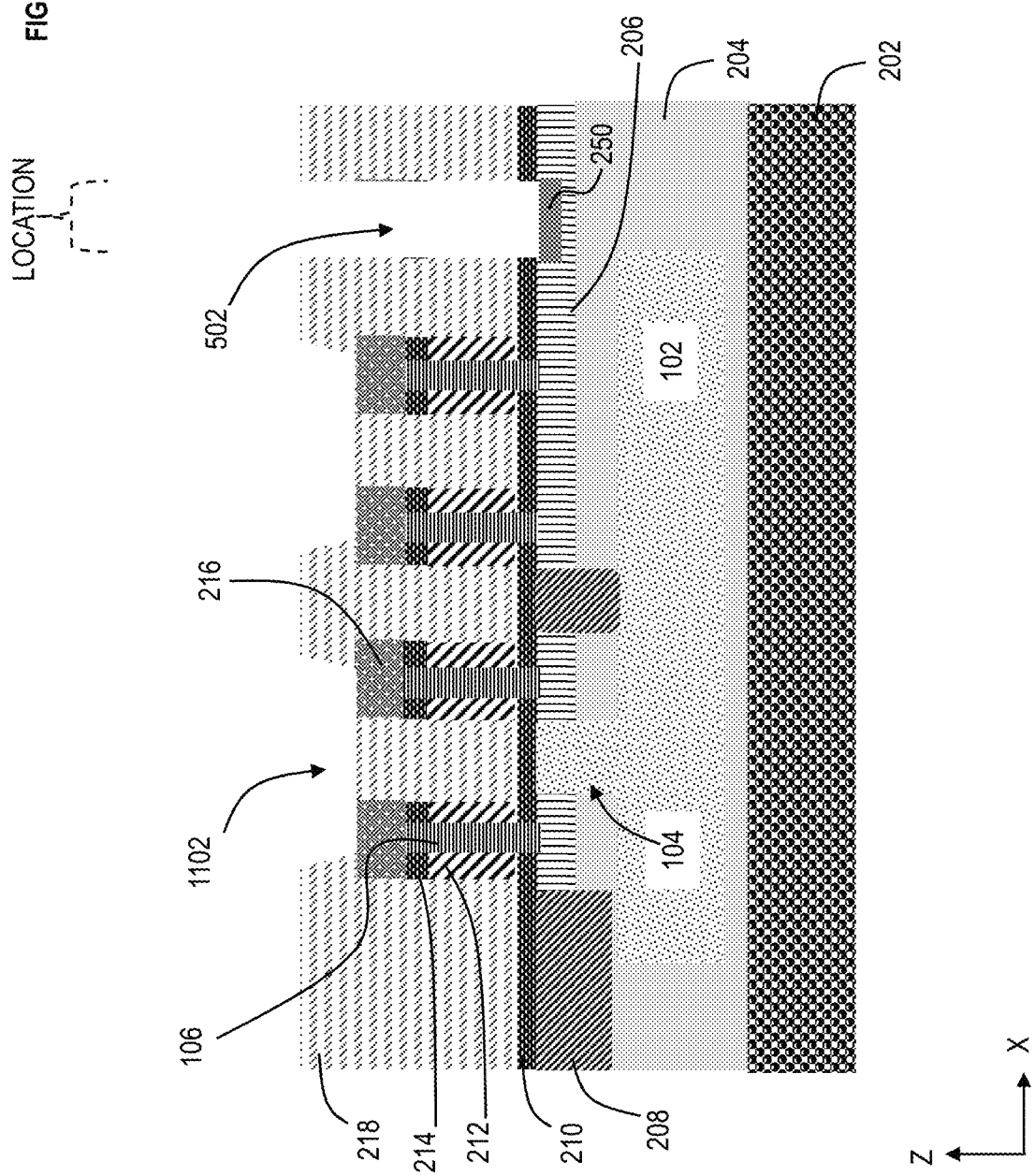
FIG. 11 depicts a cross-sectional view of the semiconductor device taken along line A-A of FIG. 1 after fabrication operations according to embodiments of the invention.

FIG. 11 depicts a cross-sectional view of the semiconductor device 100 taken along line A-A of FIG. 1 after fabrication operations according to embodiments of the invention. Source/drain contact patterning and gate patterning (not shown) are performed. Source/drain contact openings 1102 are shown above the top source/drain layers 216, in preparation for forming top source/drain metal contacts 108.

FIG. 11 shows that trench 502 at the location of dummy fin template 304 and top source/drain contact openings 1102 are ready for metallization. Metallization is performed resulting in the semiconductor device 100 with top source/drain metal contacts 108 and bottom source/drain metal contact 110, shown in FIGS. 1 and 2.

Figure 12:
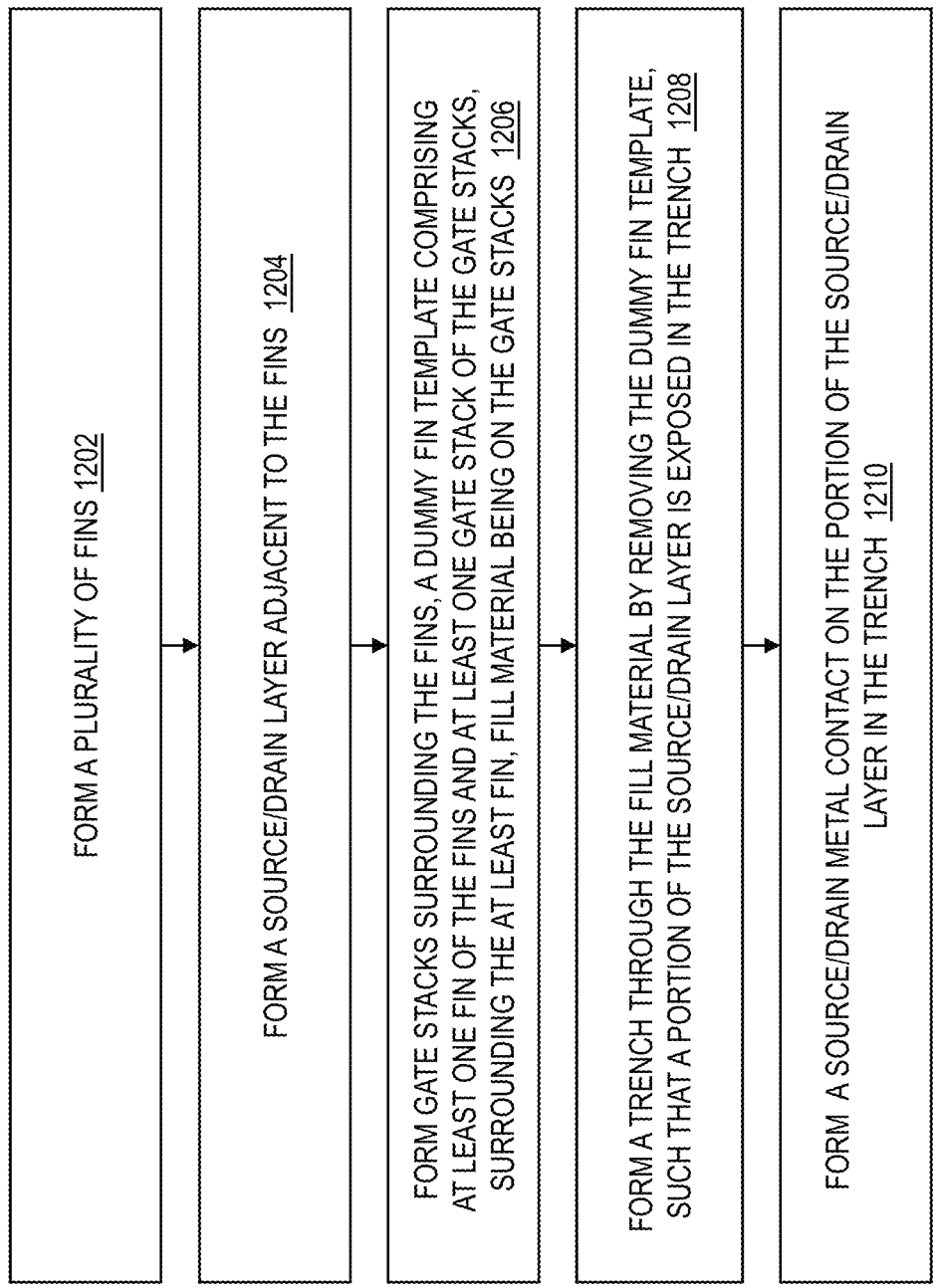
FIG. 12 is a flow chart of a method for forming a semiconductor device according embodiments of the invention.

FIG. 12 is a flow chart of a method 1200 for forming a semiconductor device 100 according embodiments of the invention. At block 1202, the method 1200 includes forming a plurality of fins 106 and forming a source/drain layer (e.g., bottom source/drain layer 206) adjacent to the fins 106 at block 1204. At block 1206, the method 1200 includes forming gate stacks 212 surrounding the fins 106, a dummy fin template 304 including at least one fin (e.g., dummy fin 302) of the fins 106 and at least one gate stack of the gate stacks 212 surrounding the at least one fin, fill material 218 being on the gate stacks. At block 1208, the method 1200 includes forming a trench 502 through the fill material 218 by removing the dummy fin template 304, such that a portion of the source/drain layer (e.g., bottom source/drain layer 206) is exposed in the trench 502. At block 1210, the method 1200 includes forming a source/drain metal contact (e.g., bottom source/drain metal contact 110) on the portion of the source/drain layer in the trench 502.

The source/drain layer is coupled to a buried power rail (e.g., buried power rail 102) through a buried power rail via (e.g., buried power rail conductive via 104). Other source/drain layers (e.g., top source/drain layers 216) are formed on top of the fins 106. Forming the trench 502 through the fill material 218 by removing the dummy fin template 304 includes removing a top source/drain layer 216 from the at least one fin 106 of the dummy fin template 304. Forming the trench 502 through the fill material 218 by removing the dummy fin template 304 includes removing the at least one fin 106. Forming the trench 502 through the fill material 218 by removing the dummy fin template 304 includes removing the at least one gate stack 212. The at least one gate stack 212 includes a dielectric material (e.g., high-k dielectric material) surrounding the at least one fin 106 and a work function material surrounding the dielectric material. Forming the trench 502 through the fill material 218 by removing the dummy fin template 304 includes removing spacer layers (e.g., top spacer layers 214) above the at least one fin 106. A doped section (e.g., highly doped section/area 250) is formed in the source/drain layer (e.g., bottom source/drain layer 206) of the trench 502.

Figure 13:
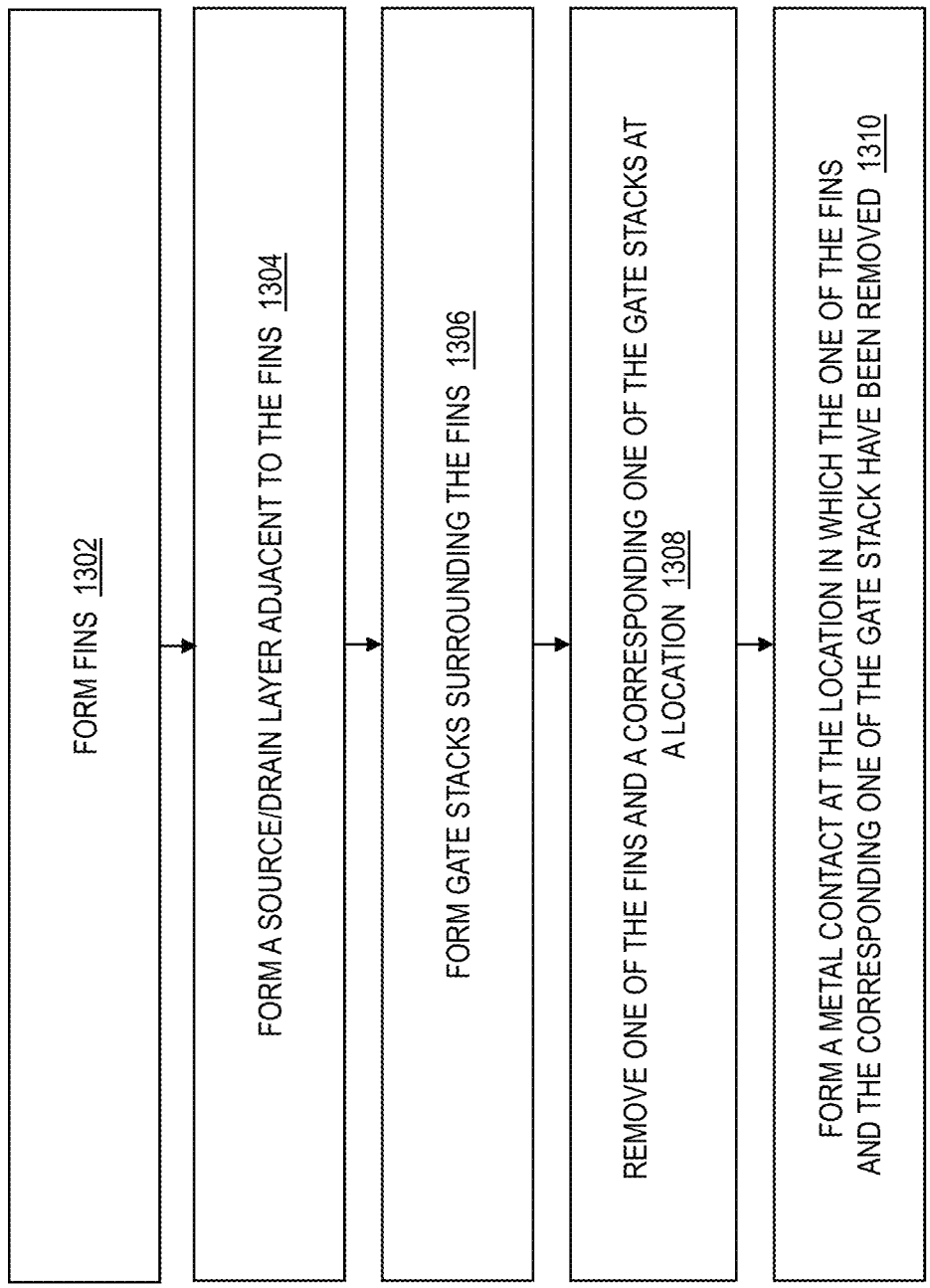
FIG. 13 is a flow chart of a method for forming a semiconductor device according embodiments of the invention.

FIG. 13 is a flow chart of a method 1300 for forming a semiconductor device 100 according embodiments of the invention. At block 1302, the method 1300 includes forming fins 106 and forming a source/drain layer (e.g., bottom source/drain layer 206) adjacent to the fins 106 at block 1304. At block 1306, the method 1300 includes forming gate stacks 212 surrounding the fins 106. At block 1308, the method 1300 includes removing one of the fins 106 and a corresponding one of the gate stacks 212 at a location, and forming a metal contact (bottom source/drain metal contact 110 at the location in which the one of the fins 106 and the corresponding one of the gate stack 212 have been removed at block 1310.

The source/drain layer is coupled to a buried power rail 102 through a buried power rail conductive via 104. Removing the one of the fins 106 and the corresponding one of the gate stacks 212 at the location includes removing a top source/drain layer (e.g., top source/drain layer 216) from the one of the fins 106. Removing the one of the fins and the corresponding one of the gate stacks at the location includes forming a trench 502 through fill material 218 and source/drain layer below the one of the fins 106 (e.g., dummy fin 302). The corresponding one of the gate stacks 212 includes a dielectric material (e.g., high-k dielectric material) surrounding the one of the fins 106 (e.g., dummy fin 302) and a work function material surrounding the dielectric material. Removing the one of the fins 106 (e.g., dummy fin 302 of fins 106) and the corresponding one of the gate stacks 212 at the location includes removing spacer layers (e.g., top spacer layers 214) above the one of the fins 106. A doped section (e.g., highly doped section/area 250) is formed in the source/drain layer (e.g., bottom source/drain layer 206) at the location. The metal contact (e.g., bottom source/drain metal contact 110) is self-aligned to the location of the one of the fins 106 (e.g., dummy fin 302) and the corresponding one of the gate stacks 212 having been removed.

Figure 14:
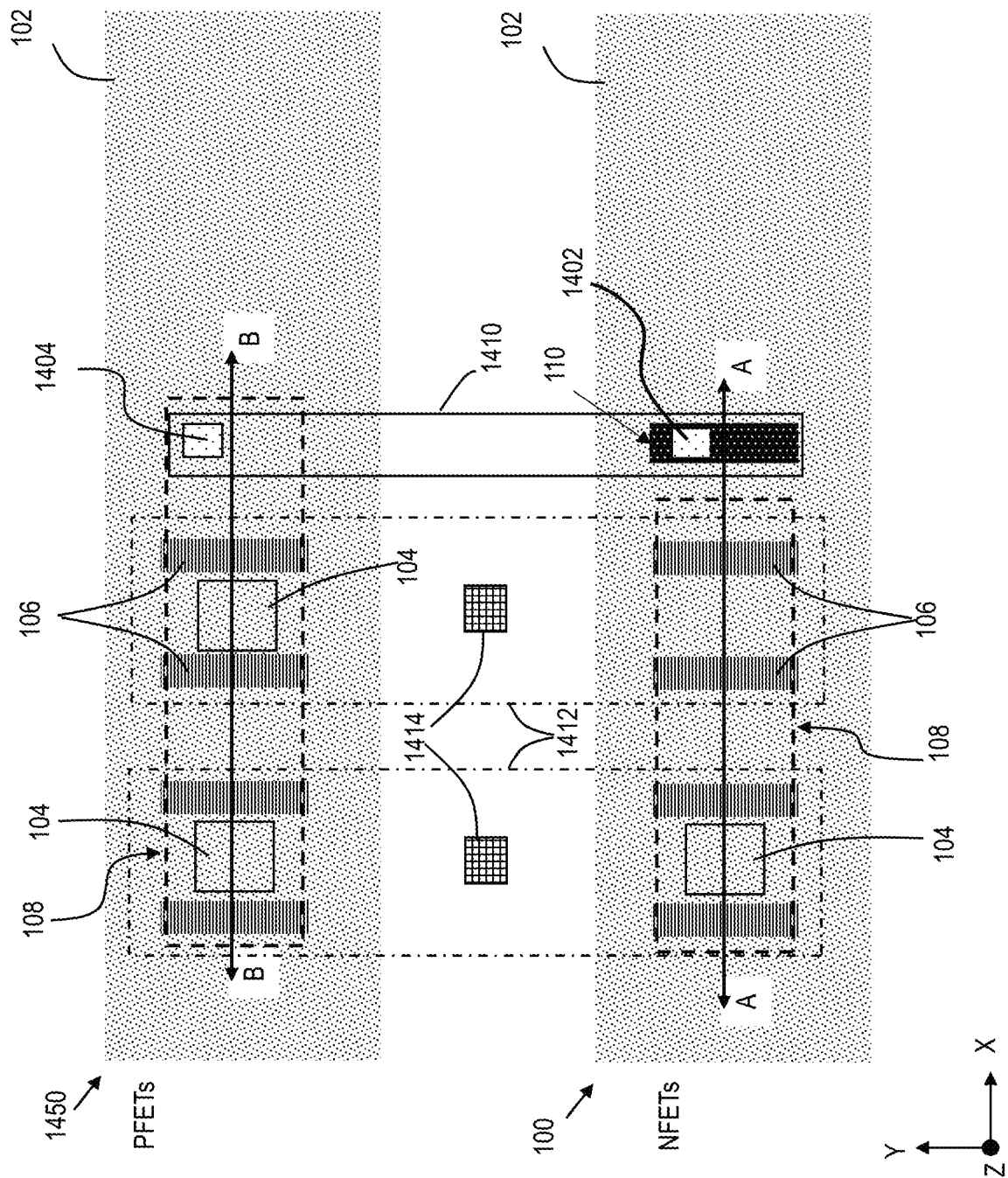
FIG. 14 depicts a simplified top-down view of a semiconductor device 1400 according to embodiments of the invention.

FIG. 14 depicts a simplified top-down view of a semiconductor device 1400 according to embodiments of the invention. Some layers in FIG. 14 are removed, and some underlying layers are represented although they would not be seen from the top. The semiconductor device 1400 is a complementary metal-oxide-semiconductor (CMOS) NAND (not AND) gate. FIG. 14 shows the semiconductor device 100 coupled to semiconductor device 1450. In one or more embodiments of the invention, the semiconductor device 100 includes two NFETs each with two fins 106 and the semiconductor device 1450 includes two PFETs each with two fins 106. Previous discussion for semiconductor device 100 applies by analogy to semiconductor device 1450, except semiconductor device 1450 includes PFETs. Also, semiconductor device 1450 excludes bottom source/drain metal contact 110.

FIG. 14 shows a modified version of semiconductor device 100 in which the top source/drain metal contact 108 is common for both NFETs. Similarly, the top source/drain metal contact 108 is common for both PFETs in semiconductor device 1450. Additionally, FIG. 14 shows a metal contact layer (M1) 1410 that contacts the top source/drain metal contact 108 in semiconductor device 1450 with the bottom source/drain metal contact 110 in semiconductor device 100. Metal via 1402 can connect to the metal contact layer 1410 in semiconductor device 100 and metal via 1404 connects to metal contact layer 1410 in semiconductor device 1450. Further, FIG. 14 shows gate material 1412 that commonly connects gate stacks 212 in both semiconductor devices 100 and 1450 and also shows individual gate contacts 1414. As noted above, gate stacks for PFETs and NFETs both have a high-k dielectric material which can be the same material in both PFETs and NFETs (or different materials). The work function material (also referred to as gate metal layer, gate conductor work function material, etc.) surrounds the dielectric material and is designated as gate material 1412 in FIG. 14. More particularly, work function material in the PFET gate stack 212 connects to and is in (physical and electrical) contact with the work function material in the NFET gate stack 212, and the connected work function materials are depicted as gate material 1412. As discussed herein, different work function materials are utilized in PFETs and NFETs.

Figure 15:
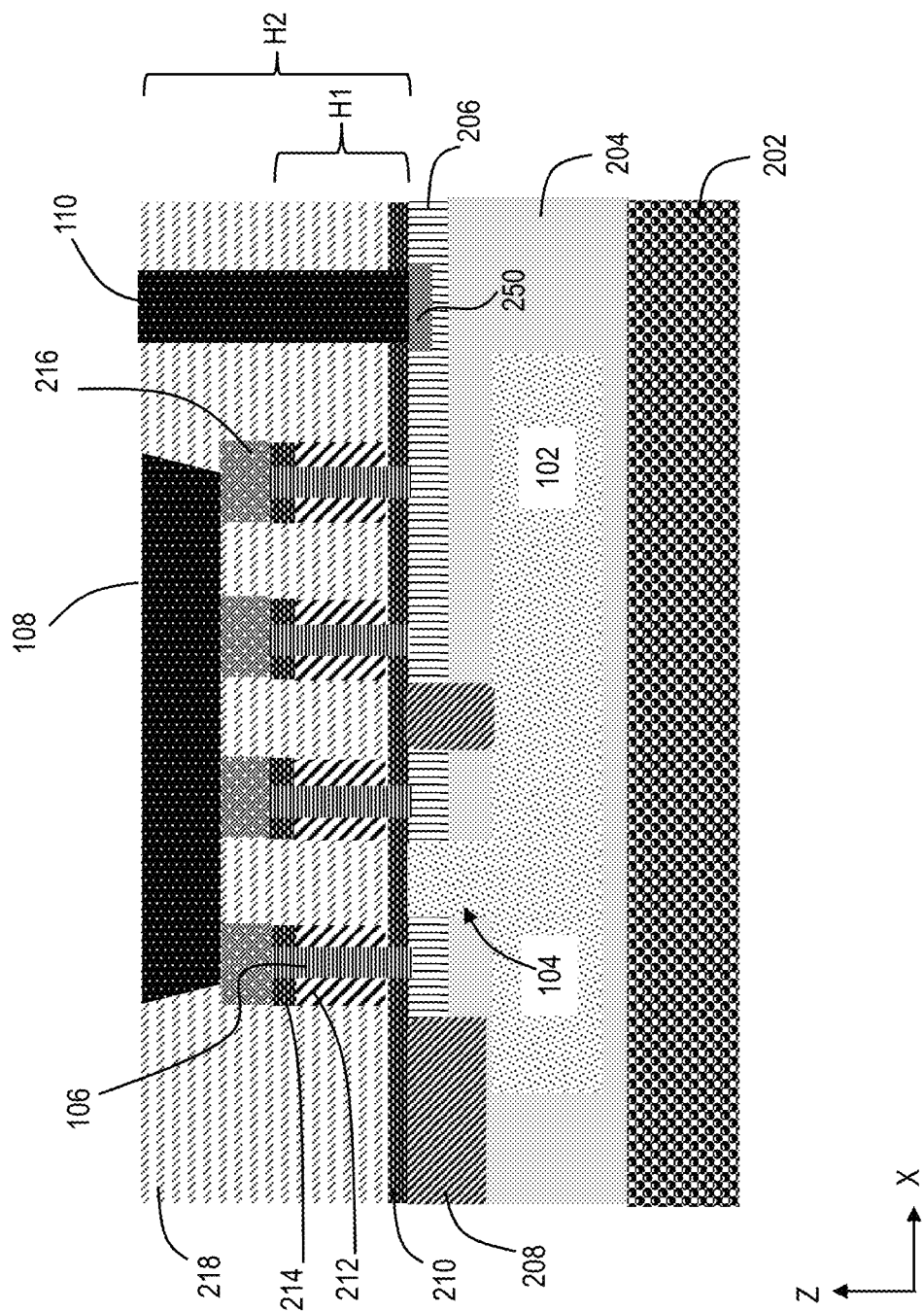
FIG. 15 depicts a cross-sectional view of the semiconductor device taken along line A-A of FIG. 14 according to embodiments of the invention.
Figure 16:
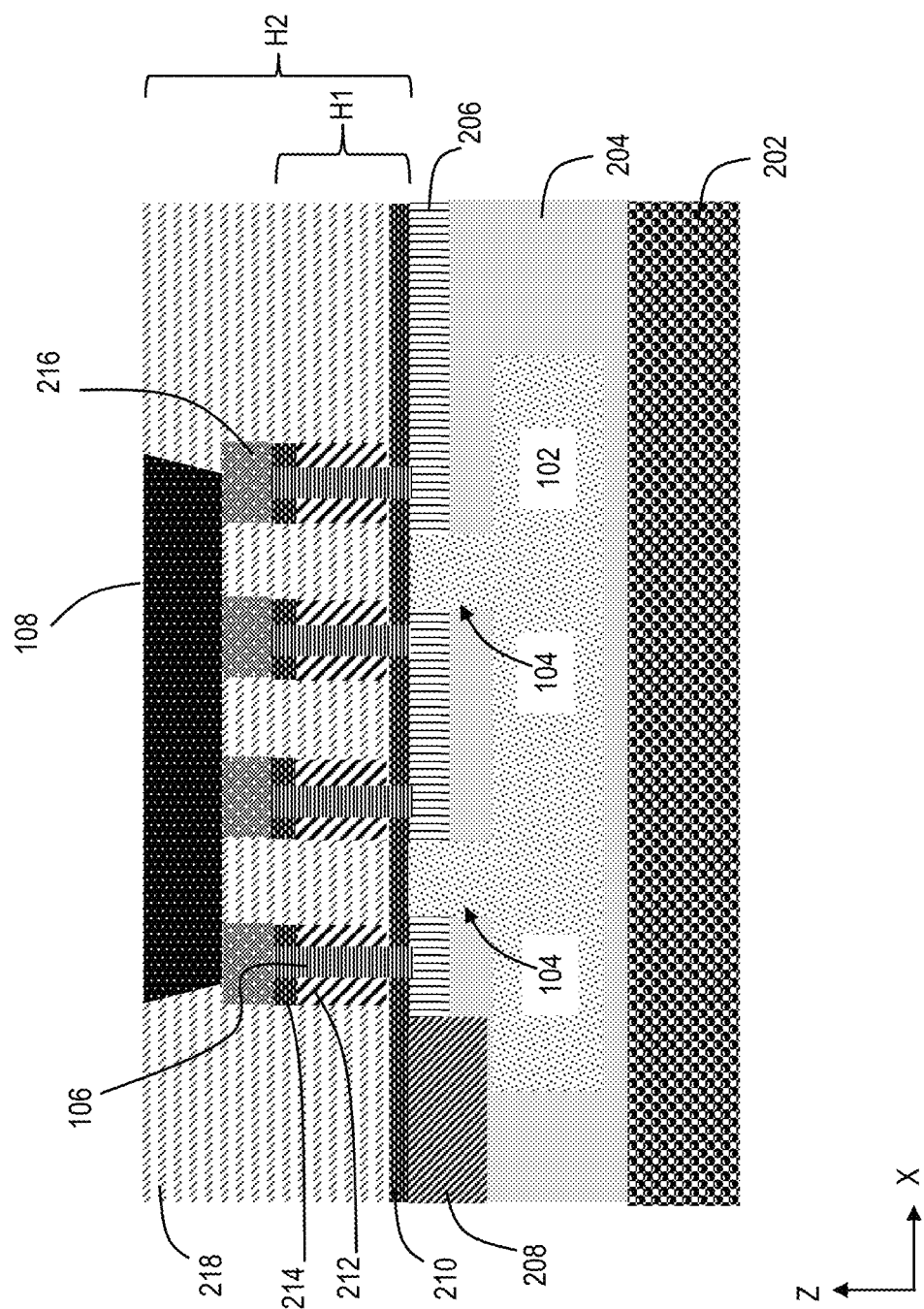
FIG. 16 depicts a cross-sectional view of the semiconductor device taken along line B-B of FIG. 14 according to embodiments of the invention.

FIG. 15 depicts a cross-sectional view of the modified version of semiconductor device 100 taken along line A-A in FIG. 14 in accordance with one or more embodiments. FIG. 15 is similar to the cross-sectional view in FIG. 2 except FIG. 15 shows semiconductor device 100 with a common or merged top source/drain metal contact 108 on top of top source/drain layers 216. FIG. 16 depicts a cross-sectional view of semiconductor device 1450 taken along line B-B in FIG. 14 in accordance with one or more embodiments. FIG. 16 is similar to the cross-sectional view of FIG. 15, except semiconductor device 1450 has two BPR conductive vias 104 and there is no STI material separating one PFET from the other PFET. Also, semiconductor device 1450 excludes bottom source/drain metal contact 110. Although FIGS. 14, 15, and 16 illustrate an example of a CMOS NAND gate, it should be appreciated that embodiments of the invention are not limited to a CMOS NAND gate and can be utilized in other types of integrated circuits.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
   forming a plurality of fins;
   forming a source/drain layer adjacent to the fins;
   forming a shallow trench isolation region adjacent to the source/drain layer;
   forming gate stacks surrounding the fins, a dummy fin template comprising at least one fin of the fins and at least one of the gate stacks surrounding the at least one fin, fill material being on the gate stacks;

forming a trench through the fill material by removing the dummy fin template, such that a portion of the source/drain layer is exposed in the trench, the shallow trench isolation region separating the portion of the source/drain layer from another portion of the source/drain layer, wherein the another portion is coupled to a buried power rail through a conductive via and is coupled to a first fin of the fins, a second fin of the fins being coupled to the portion; and forming a source/drain metal contact on the portion of the source/drain layer in the trench.

2. The method of claim 1, wherein a doped section is formed on the portion of the source/drain layer in the trench, such that the source/drain metal contact is formed in direct contact with the doped section, the doped section having a higher concentration of dopants than the portion.

3. The method of claim 1, wherein other source/drain layers are formed on top of the fins.

4. The method of claim 1, wherein forming the trench through the fill material by removing the dummy fin template comprises removing a top source/drain layer from the at least one fin of the dummy fin template.

5. The method of claim 1, wherein forming the trench through the fill material by removing the dummy fin template comprises removing the at least one fin.

6. The method of claim 1, wherein forming the trench through the fill material by removing the dummy fin template comprises removing the at least one of the gate stacks.

7. The method of claim 6, wherein the at least one of the gate stacks comprises a dielectric material surrounding the at least one fin and a work function material surrounding the dielectric material.

8. The method of claim 1, wherein forming the trench through the fill material by removing the dummy fin template comprises removing spacer layers above the at least one fin.

9. The method of claim 1, wherein the gate stacks are formed on a bottom spacer layer, a doped section being formed in the source/drain layer of the trench, the doped section being below the bottom spacer layer and above the buried power rail.

10. The method of claim 1, wherein a width dimension of the source/drain metal contact matches a combined width of one fin of the fins and one gate stack of the gate stacks.

11. A method of forming a semiconductor device, the method comprising:

forming fins;

forming a source/drain layer adjacent to the fins;

forming a shallow trench isolation region adjacent to the source/drain layer;

forming gate stacks surrounding the fins;

removing one of the fins and a corresponding one of the gate stacks at a location so as to expose a portion of the source/drain layer, the shallow trench isolation region separating the portion of the source/drain layer from another portion of the source/drain layer, wherein the another portion is coupled to a buried power rail through a conductive via and is coupled to a first fin of the fins, a second fin of the fins being coupled to the portion; and forming a metal contact at the location in which the one of the fins and the corresponding one of the gate stacks have been removed.

12. The method of claim 11, wherein removing the one of the fins and the corresponding one of the gate stacks at the location comprises removing a top source/drain layer from the one of the fins.

13. The method of claim 11, wherein removing the one of the fins and the corresponding one of the gate stacks at the location comprises forming a trench through fill material and a spacer layer below the one of the fins.

14. The method of claim 11, wherein:

the corresponding one of the gate stacks comprises a dielectric material surrounding the one of the fins and a work function material surrounding the dielectric material; and removing the one of the fins and the corresponding one of the gate stacks at the location comprises removing spacer layers above the one of the fins.

15. The method of claim 11, wherein:

a doped section is formed in the source/drain layer at the location; and the metal contact is self-aligned to the location of the one of the fins and the corresponding one of the gate stacks having been removed.

* * * * *